(12) United States Patent  (10) Patent No.: US 7,929,305 B1
Pal  (45) Date of Patent: Apr. 19, 2011

(54) POWER ELECTRONICS COOLING SYSTEM WITH FLOW ORIFICE CONTROL

(75) Inventor: Debabrata Pal, Hoffman Estates, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 81 days.

(21) Appl. No.: 12/504,036

(22) Filed: Jul. 16, 2009

(51) Int. Cl.
  *H05K 7/20* (2006.01)
(52) U.S. Cl. .. 361/699; 361/698; 165/80.4; 165/104.33; 174/15.1; 257/714
(58) Field of Classification Search .......... None
  See application file for complete search history.

(56) References Cited

U.S. PATENT DOCUMENTS

| | | | |
|---|---|---|---|
| 4,225,853 A | 9/1980 | Hamilton | |
| 5,509,468 A * | 4/1996 | Lopez | 165/144 |
| 5,774,353 A | 6/1998 | Wieloch | |
| 6,145,308 A | 11/2000 | Bueche et al. | |
| 6,198,240 B1 | 3/2001 | Notohara et al. | |
| 6,249,435 B1 | 6/2001 | Vicente et al. | |
| 6,536,510 B2 * | 3/2003 | Khrustalev et al. | 165/104.33 |
| 6,768,350 B1 | 7/2004 | Dickey | |
| 6,854,514 B2 * | 2/2005 | Sloan et al. | 165/206 |
| 6,864,659 B2 | 3/2005 | Ratz et al. | |
| 7,064,448 B2 | 6/2006 | Maier | |
| 7,292,011 B2 | 11/2007 | Beneditz | |
| 7,325,588 B2 * | 2/2008 | Malone et al. | 165/80.2 |
| 7,408,775 B2 * | 8/2008 | Walz et al. | 361/699 |
| 7,463,463 B2 | 12/2008 | Kobayashi et al. | |
| 7,475,494 B1 * | 1/2009 | Knight et al. | 34/62 |

* cited by examiner

*Primary Examiner* — Boris L Chervinsky
(74) *Attorney, Agent, or Firm* — Carlson, Gaskey & Olds

(57) ABSTRACT

A system includes a plurality of motor controllers. A coolant system for the plurality of motor controller has a common inlet line, a common outlet line, and a plurality of parallel branch lines leading to the plurality of motor controllers. A control selectively increases a flow of coolant to certain of the plurality of motor controllers or limits the flow of coolant to others of the plurality of motor controllers. In addition, a method of operating a system of motor controllers is disclosed and claimed.

19 Claims, 3 Drawing Sheets

US 7,929,305 B1

POWER ELECTRONICS COOLING SYSTEM WITH FLOW ORIFICE CONTROL

BACKGROUND OF THE INVENTION

This application relates to a power electronics cooling system wherein a plurality of motor controllers are provided with a single cooling system, and wherein the flow leading to the motor controllers is adjusted dependent on conditions at cold start-up of the aircraft.

Power electronics are becoming widely utilized in many applications. One particular application is the use of motor controllers on an aircraft. As aircraft become more and more complex, more sophisticated high power motors provide various functions. In one system, motor controllers are provided with a single cooling system which circulates a cooling fluid such that the motor controllers are maintained at an acceptable temperature during use.

The motor controllers may provide any number of functions. Some of the functions are required to be operational upon initial start-up of the aircraft, while others can be left off for a period of time until the cooling system can warm up.

Some of the larger motor controllers have a flow orifice that provides a high volume of cooling fluid, while other of the motor controllers may have a flow orifice that provides a limited amount of cooling fluid. The amount of cooling fluid is typically determined by the amount of cooling required at operational conditions. Thus, a large motor controller would typically require greater cooling fluid volume. On the other hand, some of the smaller motor controllers must be operational upon initial start-up of the aircraft, and thus demand cooling fluid initially.

A problem can occur, particularly at initial start-up in very cold conditions, for example, below −30 C. At initial start-up in very cold conditions, the viscosity of the cooling fluid can be very high, and thus there may be a tendency for the cooling fluid to flow in undesirable volumes to the larger motor controllers having a larger orifice, resulting in an insufficient amount of cooling fluid being delivered to the smaller motor controllers.

In the prior systems, it has been known to increase the system pressure for the cooling fluid. This may somewhat overcome the orifice pressure drop mentioned above during cold conditions. However, this also requires cooling system components such as cold plates, cooling lines, pumps and valves, which are all necessarily designed for the higher system pressure. These components thus become larger, heavier, and more expensive, which is all undesirable.

SUMMARY OF THE INVENTION

A system includes a plurality of motor controllers. A cooling system for the plurality of motor controller has a common inlet line, a common outlet line, and a plurality of parallel branch lines leading to the plurality of motor controllers. A control selectively increases the flow to certain of the plurality of motor controllers and limits the flow to others of the plurality of motor controllers. In addition, a method of operating a cooling system for motor controllers is disclosed and claimed.

These and other features of the present invention can be best understood from the following specification and drawings, the following of which is a brief description.

DETAILED DESCRIPTION OF THE PREFERRED EMBODIMENT

Figure 2:
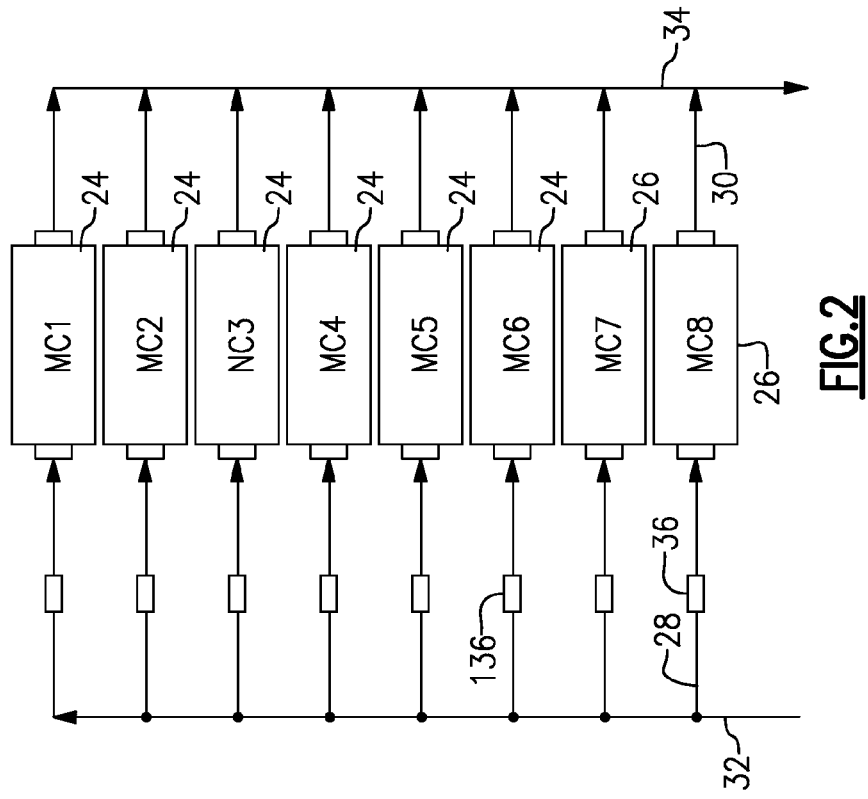
FIG. 2 is a schematic of a cooling system for the rack of FIG. 1.
Figure 1:
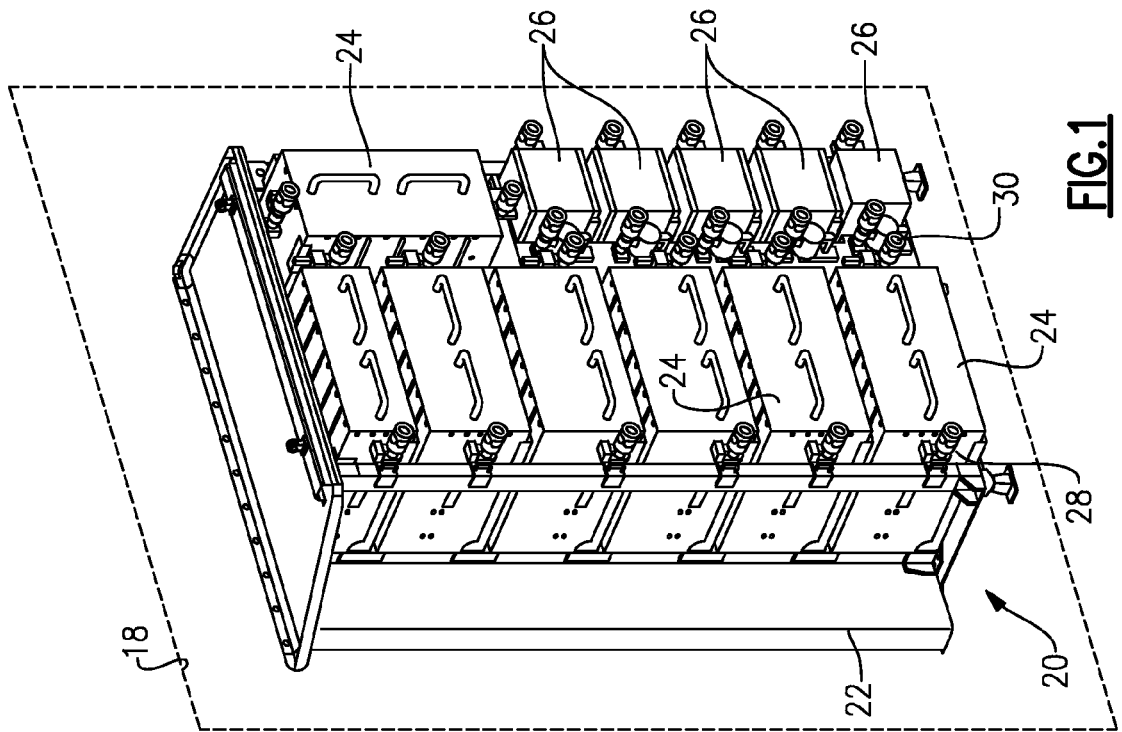
FIG. 1 shows a motor controller rack according to the present invention.

An aircraft 18 may be provided with a motor controller rack 20. The rack 20 incorporates a frame 22 mounting a plurality of large motor controllers 24, and smaller motor controllers 26. The motor controllers can provide any number of functions. Some example functions for the large motor controllers would include common motor starter controllers, cabin air compressor system motors, starter controllers for both an auxiliary power unit and a main engine, etc. Some of the smaller motor controllers could include a ram fan motor control, and a power electronics cooling system motor control.

As can be appreciated from FIG. 2, a single cooling system is provided for cooling each of the several motor controllers 24 and 26. As shown, an inlet 32 provides a cooling fluid, which circulates through the controllers 24/26, into an outlet line 34. In particular, cooling fluid flows from the inlet 32 to a plurality of parallel branch lines 28, each of which leads to one of the plurality of motor controllers 24/26. Coolant then flows from the motor controllers 24/26 to the outlet line 34 via lines 30. An orifice 36 is provided on a line leading to the small motor controllers 26, and another type orifice 136 may be mounted on the larger motor controller 24. While this distinction between the orifice 36 and the orifice 136 has been tied directly to the size of the motor controllers, other reasons may drive the selection of the different type of orifice, as will be detailed below.

Figure 3:
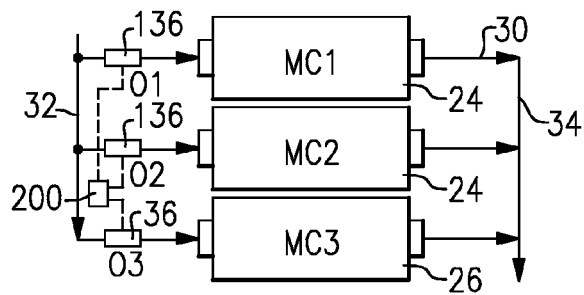
FIG. 3 shows another cooling system according to this invention.

FIG. 3 shows a portion of the FIG. 2 system. In FIG. 3, the motor controllers 24 are motor controllers which will not need to be started initially. The motor controller 26 will be of the sort which must be started immediately upon start-up of the overall system. When the system is started at very low temperatures, the cooling fluid may have such a high viscosity that insufficient cooling fluid will flow through the orifice 36 to the motor controller 26, which at the time is the only motor controller requiring cooling fluid. The orifice leading to the larger motor controller 24 will be larger due to the high volume which will be required at normal operational conditions. Thus, that orifice will allow greater flow. At start-up, this can result in insufficient fluid delivered to cool controller 26, while excess flow is delivered to the controllers 24, which may not yet be operational.

Thus, a controller 200 is provided which controls operation of the orifices 36 and 136, particularly at start-up.

Figure 4A:
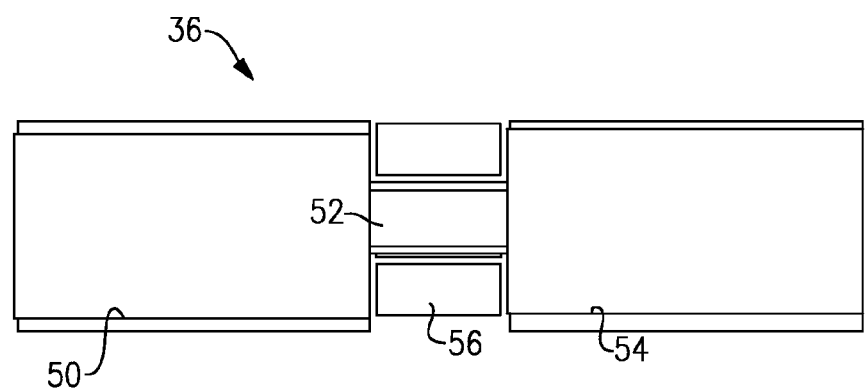
FIG. 4A shows a first flow orifice.

As shown in FIG. 4A, the orifice 36 can be provided with a heating element 56. An inlet line 50 leads to a restriction 52, and then to an outlet 54, with outlet 54 connecting to a motor controller 26.

Figure 4B:
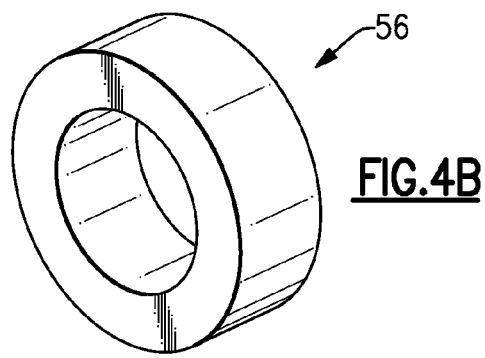
FIG. 4B shows a resistor which may be incorporated into the FIG. 4A embodiment.

The heating element 56 may be as shown in FIG. 4B, and may be a negative temperature co-efficient ceramic resistor. A voltage is applied across the resistor, and the resistor creates heat to direct into the orifice 36. The negative temperature co-efficient resistor has its resistance increase with lower temperatures. At system start-up, the resistor dissipates heat, especially at lower temperatures.

The heat from this resistor will increase the temperature of the coolant in the orifice 36, and reduce its viscosity. Reduced viscosity will result in reduced pressure drop and increased flow leading to the motor controller 26. The amount of flow can be controlled by controlling the voltage drop across the resistor. While the ceramic resistor 56 is utilized in one embodiment, other ways of providing heat to the cooling fluid in the restriction 52 may be utilized.

Figure 5A:
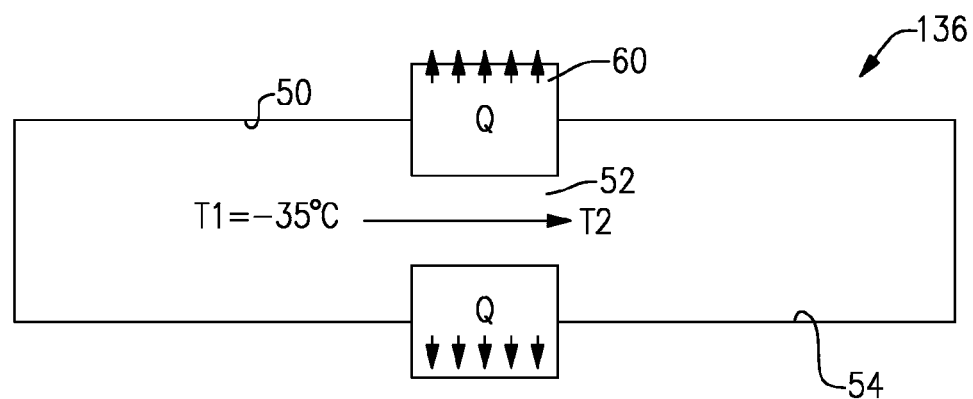
FIG. 5A shows another portion of the system of FIG. 3.
Figure 5B:
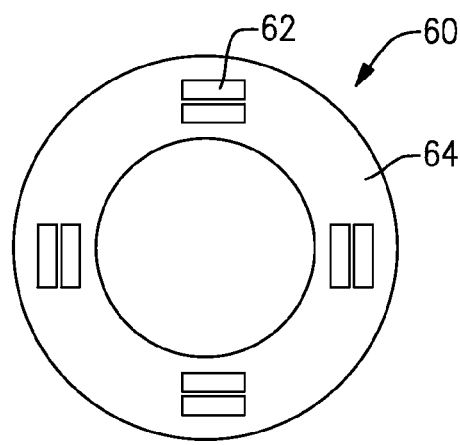
FIG. 5B shows another feature of the FIG. 5A system.

At the same time, the orifice 136 can be provided with a cooling function. Thus, as shown in FIG. 5A, a cooling element 60 may be associated with the restriction 52 between the inlet 50 and outlet 54 of the orifice 136. As shown in FIG. 5B, the cooling element 60 may be provided with a body 64 and a plurality of thermoelectric coolers 62 spaced radially around the restriction 52. Thermoelectric coolers are known, and receive a voltage to provide cooling. This cooling will increase the viscosity of the coolant flowing through the restriction 52, and thus reduce the volume flow leading to the motor controller 24 which does not require cooling as it is not initially operational at start-up.

With the present invention, the control 200 is thus able to control the fluid flowing through the orifices 36 and 136 and ensure that adequate coolant fluid flows to those controllers that are being utilized initially at start-up. Notably, soon after start-up, the coolant will heat up sufficiently such that its viscosity is low enough that it will operate properly even without the control at the orifices 36 and 136. At that point, the control may cease.

While both cooling and heating are disclosed, systems that do only one of the two would come within the scope of this invention, and the use of only one of the two will still increase flow to the desired controllers, and decrease flow to the others.

One coolant that may be used is available under the trade name Dow-Frost™. Essentially, this is a propylene glycol mixture with water, and may be a 60/40 mixture. Of course, other coolant fluid would come within the scope of this invention.

Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. A motor controller system comprising: a plurality of motor controllers; a coolant system for said plurality of motor controller, said coolant system having a common inlet line, a common outlet line, and a plurality of parallel branch lines leading to said plurality of motor controllers; and a control for selectively increasing a flow of coolant to certain of said plurality of motor controllers at start-up, wherein there is an orifice positioned in the parallel branch lines leading to each of said motor controllers, and wherein at least one orifice is either associated with a heating element or a cooling element.

2. The system as set forth in claim 1, wherein the viscosity of the coolant leading to the motor controllers that are to receive increased flow is reduced, while the viscosity of the coolant leading to other motor controllers is increased.

3. The system as set forth in claim 1, wherein there is said orifice positioned in the parallel branch lines leading to each of said motor controllers.

4. The system as set forth in claim 3, wherein said heating element is positioned in the orifice associated with said motor controllers that are to receive increased flow.

5. The system as set forth in claim 4, wherein said heating element is turned on at initial start-up of the system.

6. The system as set forth in claim 5, wherein other motor controllers, that are to receive limited flow, have their orifices provided with said cooling element.

7. The system as set forth in claim 4, wherein other motor controllers, that are to receive limited flow, have their orifices provided with said cooling element.

8. The system as set forth in claim 7, wherein said cooling element includes a thermal electric couple.

9. The system as set forth in claim 4, wherein said heating element includes a ceramic negative co-efficient resistor.

10. The system as set forth in claim 3, wherein other motor controllers, that are to receive limited flow, have their orifices provided with a cooling element.

11. A method of providing coolant to a motor controller system comprising the steps of: directing a coolant to a plurality of motor controllers through a common inlet line, and a plurality of parallel branch lines leading to said plurality of motor controllers, wherein there is an orifice positioned in the parallel branch lines leading to each of said motor controllers; and selectively increasing the flow of coolant to certain of said plurality of motor controllers at start-up by either heating or cooling at least one of the orifices.

12. A motor controller and cooling system for use on an aircraft comprising:
a plurality of motor controllers, with a first group that will be operating at initial start-up, and a second group that will be initiated some time after initial start-up;
a cooling system including a common inlet, a common outlet, and a plurality of parallel branch lines leading from said common inlet to each of said plurality of motor controllers, and there being an orifice in each of said parallel branch lines, with an orifice associated with each of said first group of motor controllers being provided with a heating element, and the orifice provided with each of said second group of motor controllers being provided with a cooling element; and
a control for initiating heating of a coolant passing through the coolant passing through the orifices associated with said first group of motor controllers, and providing cooling to the orifices associated with said second group of motor controllers at initial start-up of the system.

13. The system as set forth in claim 12, wherein said heating element includes a ceramic negative co-efficient resistor.

14. The system as set forth in claim 12, wherein said cooling element includes a thermal electric couple.

15. The system as set forth in claim 1, wherein, after start-up, the control ceases.

16. The system as set forth in claim 1 wherein the at least one orifice includes a restriction section, and the restriction section is provided with a heating or a cooling element.

17. A motor controller system comprising: a plurality of motor controllers; a coolant system for said plurality of motor controller, said coolant system having a common inlet line, a common outlet line, and a plurality of parallel branch lines leading to said plurality of motor controllers; a control for selectively increasing a flow of coolant to certain of said plurality of motor controllers; wherein there is an orifice positioned in the parallel branch lines leading to each of said motor controllers; and wherein the control selectively increases or decreases the temperature of at least one of the orifices in order to increase the flow of coolant to said certain of said plurality of motor controllers.

18. The system as set forth in claim 17, wherein the control selectively decreases the temperature of at least one of the orifices in order to increase the flow of coolant to certain of said plurality of motor controllers.

19. The system as set forth in claim 17, wherein each orifice includes a restriction section, and the restriction section is provided with a heating or a cooling element.

* * * * *